(12) United States Patent
Fong et al.

(10) Patent No.: US 6,215,700 B1
(45) Date of Patent: Apr. 10, 2001

(54) PMOS AVALANCHE PROGRAMMED FLOATING GATE MEMORY CELL STRUCTURE

(75) Inventors: Steven J. Fong, Santa Clara; Stewart G. Logie, Campbell; Sunil D. Mehta, San Jose, all of CA (US)

(73) Assignee: Vantis Corporation, Sunnyvale, CA (US)

(*) Notice: Subject to any disclaimer, the term of this patent is extended or adjusted under 35 U.S.C. 154(b) by 0 days.

(21) Appl. No.: 09/226,702

(22) Filed: Jan. 7, 1999

(51) Int. Cl.[7] ................................................. G11C 16/04
(52) U.S. Cl. ............................... 365/185.1; 365/185.14; 365/185.18; 257/314
(58) Field of Search ........................... 365/185.1, 185.14, 365/185.18; 257/314

(56) References Cited

U.S. PATENT DOCUMENTS

| | | | |
|---|---|---|---|
| 4,037,242 | 7/1977 | Gosney | 357/23 |
| 4,885,719 | 12/1989 | Brahmbhatt | 365/181 |
| 5,103,425 | 4/1992 | Kuo et al. | 365/226 |
| 5,366,915 | 11/1994 | Kodama | 437/43 |
| 5,491,657 | 2/1996 | Haddad et al. | . |
| 5,554,552 | 9/1996 | Chi | 437/43 |
| 5,587,945 | * 12/1996 | Lin et al. | 365/185.1 |
| 5,596,524 | * 1/1997 | Lin et al. | 365/185.1 |
| 5,615,150 | 3/1997 | Lin et al. | 365/185.17 |
| 5,640,346 | 6/1997 | Preslar | 365/185.1 |
| 5,646,901 | 7/1997 | Sharpe-Geisler et al. | 365/218 |
| 5,719,427 | 2/1998 | Tong et al. | 257/355 |
| 5,754,471 | * 5/1998 | Peng et al. | 365/185.1 |
| 5,761,116 | 6/1998 | Li et al. | 365/185.1 |
| 5,783,457 | 7/1998 | Hsu | 437/35 |
| 5,867,425 | * 2/1999 | Wong | 365/185.08 |
| 5,872,732 | * 2/1999 | Wong | 365/185.18 |
| 5,886,379 | * 3/1999 | Wang | 257/318 |
| 5,912,488 | 6/1999 | Kim et al. | 257/316 |
| 5,969,992 | 10/1999 | Mehta et al. | 365/185.28 |
| 6,028,789 | * 2/2000 | Mehta et al. | 365/185.14 |
| 6,034,893 | * 3/2000 | Mehta | 365/185.14 |

FOREIGN PATENT DOCUMENTS

| | | |
|---|---|---|
| 0 295 935 A1 | 12/1988 | (EP) . |
| 0 354 457 | 2/1990 | (EP) . |
| 0 714 133 | 5/1996 | (EP) . |
| 0 776 049 | 5/1997 | (EP) . |
| 0 865 045 | 9/1998 | (EP) . |
| 2 022 922 | 12/1979 | (GB) . |
| 60-053083 | 3/1985 | (JP) . |
| 6-204492 | 7/1994 | (JP) . |
| 10-074850 | 3/1998 | (JP) . |
| 10-223782 | 8/1998 | (JP) . |
| WO 93 18519 | 9/1993 | (WO) . |
| WO 97 02605 | 1/1997 | (WO) . |

OTHER PUBLICATIONS

Ranaweerna, et al., "Performance limitations of a flash $E^2PROM$ programmed cell, with Zener induced hot electrons," University of Toronto Department of Electrical and Computer Engineering (1997).

* cited by examiner

*Primary Examiner*—David Nelms
*Assistant Examiner*—Connie C. Yoha
(74) *Attorney, Agent, or Firm*—Fliesler, Dubb, Meyer & Lovejoy LLP

(57) ABSTRACT

A non-volatile memory cell structure which includes a floating gate, a reverse breakdown element and a read transistor. The reverse breakdown element is at least partially formed in a first region of a first conductivity type in a semiconductor substrate, and underlies a portion of the floating gate; and the read transistor is at least partially formed in the first region and connected to the reverse breakdown element. In a further embodiment a control gate is capacitively coupled to the floating gate and is formed in a second region of the substrate, outside the well region.

24 Claims, 6 Drawing Sheets

| Operation | ACG | BL | WL | WC | FG |
|---|---|---|---|---|---|
| Erase (bulk) | 0V | 8V | 0V | HiZ | -ve |
| Program | 8V | 8V | 0V | HiZ | $-ve + \Delta V_p$ |
| Not progr. | 0V | 8V | 0V | HiZ | $-ve - \Delta_p$ |
| Not progr. | 8V | 3.3V | 0V | HiZ | -ve |
| Read | 3.3V | ground | 3.3V | 3.3V | $-ve (or +\Delta V_p)$ |

$\Delta_p$ = Programming disturb; it should be less than 1V.

$\Delta V_p$ = It will be in 3–8V range depending on programming time.
$\Delta V_p \cong 4V$ for $t_{prog} \cong 10\mu s$.

*Assumed that the junction breakdown voltage is at 7.5V or below so that 8V operation is sufficient for junction breakdown.

FIG. 4B
*(PRIOR ART)*

PMOS AVALANCHE PROGRAMMED FLOATING GATE MEMORY CELL STRUCTURE

BACKGROUND OF THE INVENTION

1. Field of the Invention

The invention relates to nonvolatile memory, and particularly a non-volatile memory structure optimized for particular applications.

2. Description of the Related Art

Non-volatile memory devices of the type commonly referred to in the art as EPROM, EEPROM, or Flash EEPROM serve a variety of purposes, and are hence provided in a variety of architectures and circuit structures.

As with many types of integrated circuit devices, some of the main objectives of non-volatile memory device designers are to increase the performance of devices, while decreasing device dimensions and consequently increasing circuit density. Cell designers strive for designs which are reliable, scalable, cost effective to manufacture and able to operate at lower power, in order for manufacturers to compete in the semiconductor industry. EEPROM devices are one such device that must meet these challenges. In some applications, such as flash memory cards, density is at a premium, while in applications such as programmable logic devices (PLD's), performance and reliability is more important and space is at less of a premium.

EEPROMS (electrically erasable/programmable read-only memories) generally employ Fowler-Nordheim (F-N) tunneling for both programming and erasing. The term "flash", when used with "EEPROM", generally refers to a device programmed by hot electron injection. Generally, flash technology employs a floating gate structure with a thin oxide layer between the floating gate and the drain side of the transistor where Fowler-Nordheim tunneling occurs.

As process technology moves toward the so-called 0.18 and 0.13 micron processes, the conventional "stacked gate" EEPROM structure has given way to different cell designs and array architectures, all intended to increase density and reliability in the resulting circuit.

An alternative to the aforementioned FN tunneling-based cell structure is presented in Ranaweera, et al., "Performance Limitations of a Flash EEPROM Cell, Programmed With Zener Induced Hot Electrons," University of Toronto Department of Electrical Engineering (1997). Discussed therein is a flash EEPROM cell which accomplishes programming and erase by establishing a reverse breakdown condition at the drain/substrate junction, generating hot electrons which are then coupled to the floating gate to program the cell.

FIGS. 1A, 1B and 1C of Ranaweera, et al. are reproduced as FIGS. 1A, 1B and 1C of the present application. FIGS. 1B and 1C show cross-sections of the cell shown in FIG. 1A. As shown in FIG. 1C, a "ZEEPROM" cell comprises a source and drain region, floating gate and control gate, with a P+ pocket implant extending part way across the width of the drain region to generate hot electrons for programming. The flash ZEEPROM cells are fabricated using CMOS compatible process technology, with the addition of a heavily doped boron implant for the P+ region replacing the LDD region. A sidewall spacer is necessary to form the self-aligned N+ source and drain regions and to avoid counter-doping of the P+ pocket.

To program the flash ZEEPROM cell, the P+ N+ junction is reverse-biased to create an electric field of approximately $10^6$ volt/cm. and generate energetic hot electrons independent of the channel length. The P+ region adjacent to the drain enhances this generation. A low junction breakdown current can be used for programming by optimizing the P+ N+ junction depth and controlling the applied drain voltage. One disadvantage of this cell is that a low drain voltage (approximately one volt) must be used to read the cell since the P+ region exhibits a low breakdown voltage which can contribute to "soft programming." Another disadvantage is that the cell provides lower read current compared with conventional flash memory cells. Erasing in the cell is performed by Fowler-Nordheim tunneling of electrons from the floating gate to the source region using a negative gate voltage and supply voltage connected to the source similar to conventional flash EEPROM cells.

Another alternative cell structure using hot election programming generated by a reverse breakdown condition at the drain is described in the context of a method for bulk charging and discharging of an array of flash EEPROM memory cells in U.S. Pat. No. 5,491,657 issued to Haddad, et al., assigned to the assignee of the present invention. In Haddad, et al., a cell structure similar to that shown in cross-section in FIG. 1B of the present application may be used, as well as a substrate-biased p-well in n-well embodiment. In the first embodiment, an N+ source region includes an N+ implant region and an N diffusion region, and the erase operation (removing electrons) is accomplished by applying (−)8.5 volts to the control gate for 100 milliseconds, and (+)5 volts to the source for 100 milliseconds, with the drain being allowed to float. In contrast, programming (adding electrons to the gate) is achieved by applying a negative 8.5 volt to the substrate for 5 microseconds, zero volts to the drain and control gate with the source floating. The bulk charging operation can just as easily be done on the source side rather than the drain side in a case where the cell is provided in a P well by applying −8.5 volts to the P well for 5 microseconds, 0 volts to the source and control gate with the drain being allowed to float.

Yet another structure and method for programming a cell is detailed in co-pending U.S. patent application Ser. No. 08/871,589 inventors Hao Fang, et al., filed Jul. 24, 1998 and assigned to the assignee of the present application. FIGS. 1A and 1B of the Fang, et al. application are reproduced herein as FIGS. 2A and 2B, and FIGS. 2A and 2B of the Fang application are reproduced as FIGS. 3A and 3B of the present application. The Fang, et al. application uses the programming method disclosed in Haddad, et al. to form a high density, low program/erase voltage and current, and fast byte programming and bulk erase and fast reading speed non-volatile memory structure specifically designed for programmable logic circuit applications.

In Fang, et al. the non-volatile memory cell 10 in FIGS. 2A, 2B is formed of a P substrate 12 having embedded therein an N+ source region 14, an N-type diffused drain region 16, a floating gate 18 capacitively coupled to the P substrate 12 through a tunnel oxide 20, or other gate dielectric such as nitride oxide; and a control gate 22 coupled capacitively to the floating gate 18 through an oxide/nitride/oxide, or other type of inter polysilicon dielectric, film 24,26. Diffused region 16 is formed of a shallowly diffused but heavily doped N-type junction, while source region 14 is formed of a deeply diffused but lightly doped N junction. The relatively thin gate dielectric 20 (an oxide of 60 to 150 Å in thickness) is interposed between top surface of substrate 12 and conductor polysilicon floating gate 18. Control gate 22 is supported above the floating gate by the inter-poly dielectric layer 24,26. Avalanche program and erase bias configurations of the memory cell of the Fang, et al. application are shown in FIGS. 3A and 3B, respectively.

Program and erase operations are illustrated in FIGS. 3A and 3B. To program the cell, electron injection is effected from the drain side. In this case, programming operation is accomplished by applying +3 volts on the drain and −6 volts on the P substrate so as to shift upwardly the threshold voltage $V_t$ by 4 volts in approximately 0.002 seconds. To erase, holes are injected from the drain side by applying +6.5 volts on the drain and −3 volts on the P substrate so as to shift down with the voltage threshold $V_t$ by 4 volts. Utilizing the substrate bias configuration suppresses hot hole injection due to the fact that the location of the high field is away from the oxide interface, the magnitude of the maximum field strength is reduced by more than 50%, and the vertical field does not favor hole injection.

FIGS. 4A and 4B show FIGS. 10A and 10B of the Fang, et al. application which teach a single polysilicon layer embodiment of the Fang, et al. cell. In such an embodiment, the control gate is replaced with a diffusion region. The control gate can be switched between 0 volts and $V_{cc}$ to select and de-select the cell during the read period and between $V_{jb}$ and 0 volts to program and erase the cells as set forth above. A select transistor is added at the source side to enable a fast read of the memory cell. In this operation, the gate of the added select transistor is set at less than or equal to zero volts during program and erasing and at $V_{cc}$ with $V_d$ less than or equal to $V_{cc}$ and $V_{dm}$ 0 volts via turning on the memory cell for the read period. ($V_d$ is the drain voltage for the select transistor and $V_{dm}$ is the drain voltage for the memory transistor.) Cell size is decreased in comparison to conventional single poly memory cells for programmable logic devices. The bias configurations for the single poly memory cell are disclosed in FIG. 4B.

Generally, arrays of such individual memory cells are formed on a single substrate and combined with sense and read circuitry, and coupled by row-wise and column-wise conductive regions or metallic conductors to allow for array wide bulk program and erase as well as selected bit programming.

In the aforementioned prior art references, each of the devices is provided as an NMOS transistor in a P-doped substrate. The only exception is the Haddad et al reference wherein an NMOS transistor is formed in a p-well which itself is formed in an n-well in a p-type substrate.

Each of the aforementioned configurations presents advantages and disadvantages in use in particular applications. Nevertheless, improvements in both the structure of individual cells and the manner in which they are connected together will result in more reliable, stable, faster, and lower power devices.

SUMMARY OF THE INVENTION

The invention, roughly described, comprises a non-volatile memory cell structure which includes a floating gate, a reverse breakdown element and a read transistor in a substrate of a first conductivity type. The reverse breakdown element is at least partially formed in a well region of a second conductivity type in a semiconductor substrate, capacitively coupled to the floating gate; and the read transistor is at least partially formed in the well region, and connected to the injection element.

In a further embodiment a control gate is capacitively coupled to the floating gate.

In a further aspect, the control gate comprises a diffused region in a second region of the semiconductor substrate comprising a portion of the substrate of said first conductivity type.

In yet another aspect, a first gate oxide overlies said first channel region and a second gate oxide overlies said second channel region. The first gate oxide may have a thickness in a range of about 70 to 110 Å, while the second has the same or a different thickness in a range of about 30 to 80 Å.

The invention thus provides an individually selectable avalanche/Zener injection EEPROM cell, suitable for use in memory arrays and programmable logic devices.

BRIEF DESCRIPTION OF THE DRAWINGS

The invention will be described with respect to the particular embodiments thereof. Other objects, features, and advantages of the invention will become apparent with reference to the specification and drawings in which:

FIG. 4B is a table showing the voltages utilized in accordance with the single poly memory cell shown in FIG. 4A.

DETAILED DESCRIPTION

In one aspect, the invention comprises a novel EEPROM cell structure incorporating avalanche/Zener based reversed breakdown generation of hot electrons in an element.

In the present invention, individual memory cells having a structure as set forth in the present detailed description and the accompanying Figures, or cells having a structure equivalent to or similar to that set forth in Ranaweera, et al. and/or co-pending U.S. patent application Ser. No. 08/871, 589 to Hao Fang, et al., or those set forth in U.S. Pat. No. 5,491,657, each of the foregoing disclosures being hereby specifically incorporated herein by reference, may be utilized in accordance with the principles of the present invention.

In the following description, numerous details, for example specific materials process steps, etc., are set forth in order to provide a thorough understanding of the invention. It will be readily understood, however, to one of average skill in the art that specific details need not be employed to practice the present invention. Moreover, specific details of particular processes or structures may not be specifically presented in order to not unduly obscure the invention where such details would be readily apparent to one of average skill in the art. Those having ordinary skill in the art and access to the teachings described herein will recognize additional modifications and applications and embodiments within the scope of the present invention.

As discussed herein, non-volatile memory cells are typically utilized with accompanying circuitry in cell structures. Such circuitry includes means for controlling voltages applied to the respective terminals of the floating gate device, and for reading the state of the device after it is programmed. It will be recognized that the manner in which the cell of the present invention is so connected may vary in accordance with any number of known schemes, and may include those manners of operation disclosed in co-pending U.S. patent application Ser. No. 09/217,646 filed Dec. 21, 1998, entitled DUAL POCKET, TWO SIDED PROGRAM/ERASE NON-VOLATILE MEMORY CELL, Inventor Sunil D. Mehta, incorporated fully herein by reference.

Figure 1B:
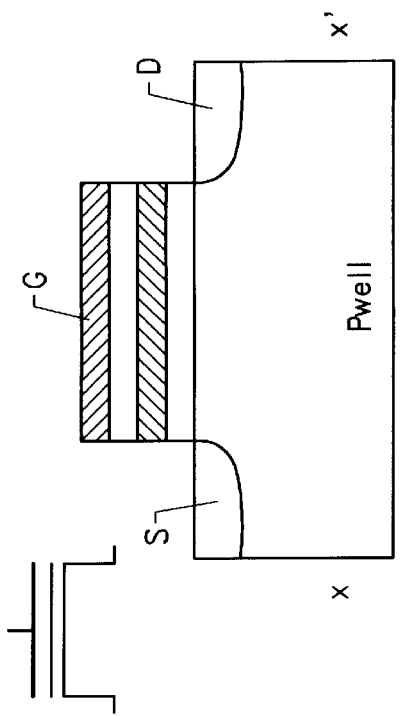
FIGS. 1B and 1C are cross-sections of a prior art reverse breakdown cell, and the Zener breakdown cell shown in FIG. 1A, respectively.
Figure 1C:
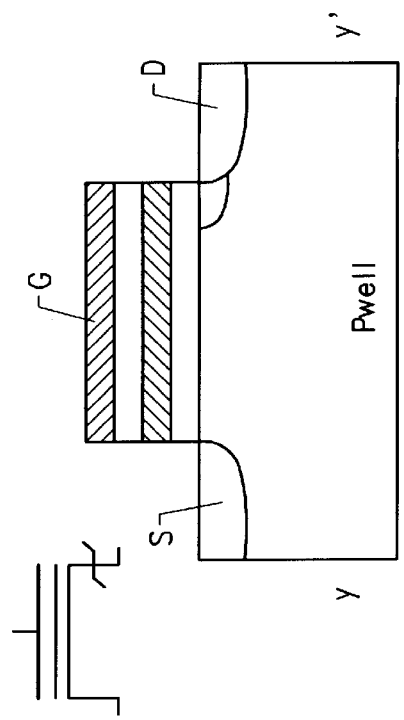
Figure 1A:
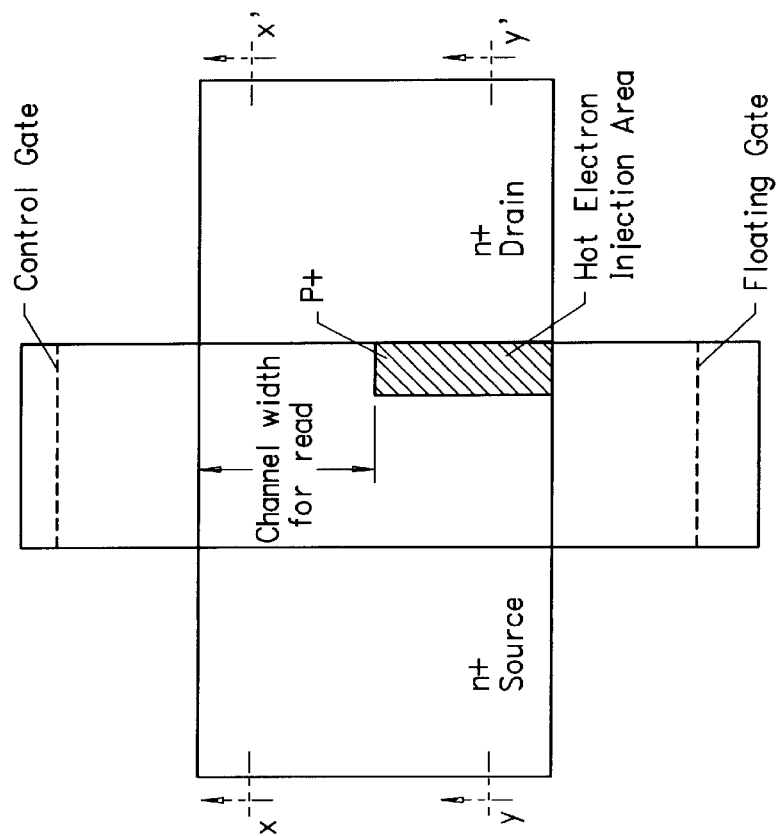
FIG. 1A is a plan view of a Zener breakdown based flash EEPROM cell.
Figure 2A:
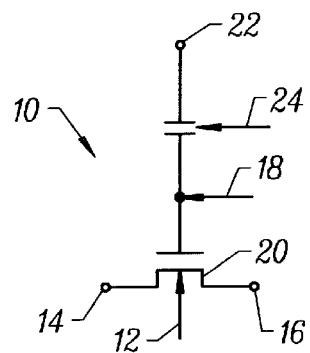
FIG. 2A is a schematic diagram of the non-volatile memory cell of the prior art.
Figure 2B:
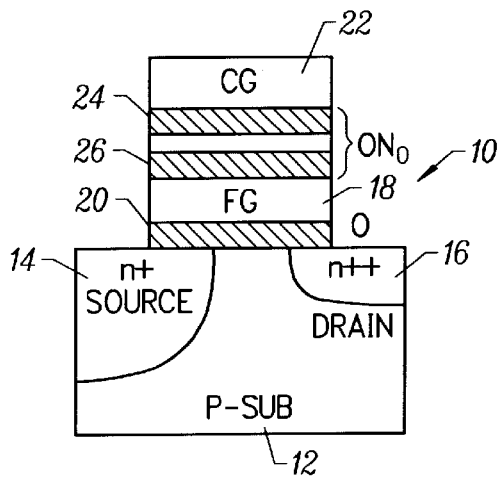
FIG. 2B shows a cross-sectional view of a non-volatile memory cell in accordance with the prior art.
Figure 3A:
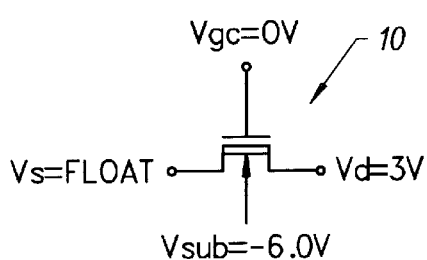
FIGS. 3A and 3B, respectively, show avalanche program and erase bias configurations of a memory cell in accordance with the prior art.
Figure 3B:
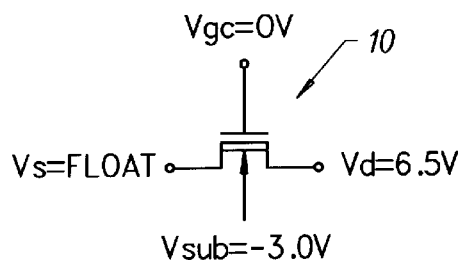
Figure 4A:
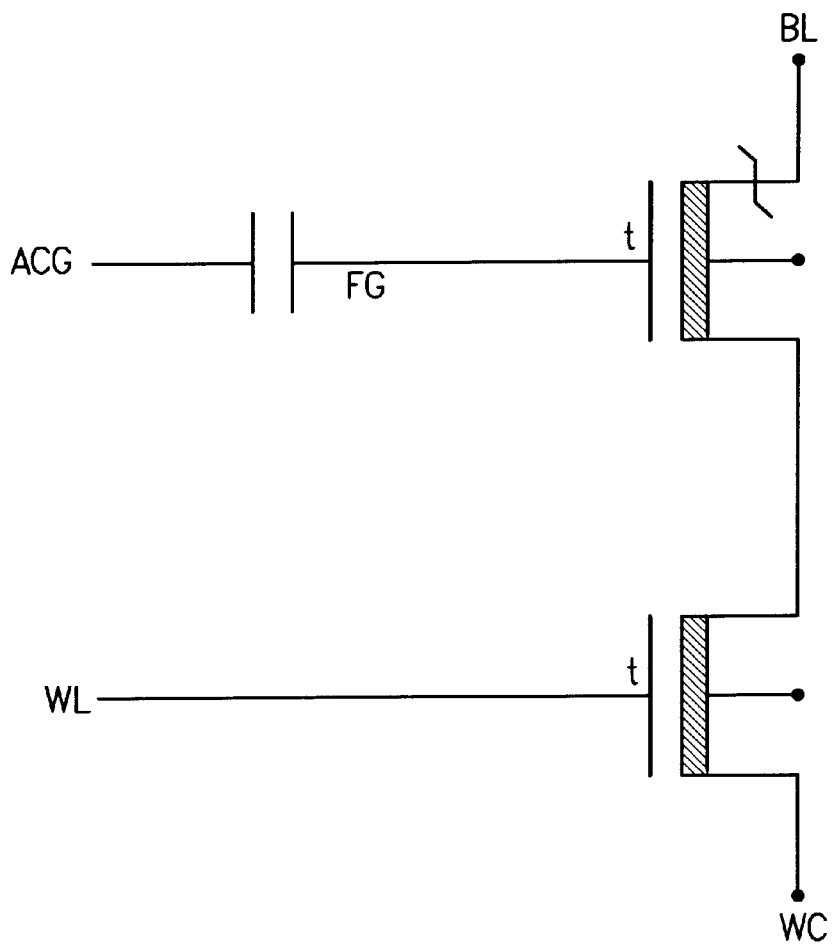
FIG. 4A is a schematic diagram of a single poly memory cell in accordance with the prior art.
Figure 5:
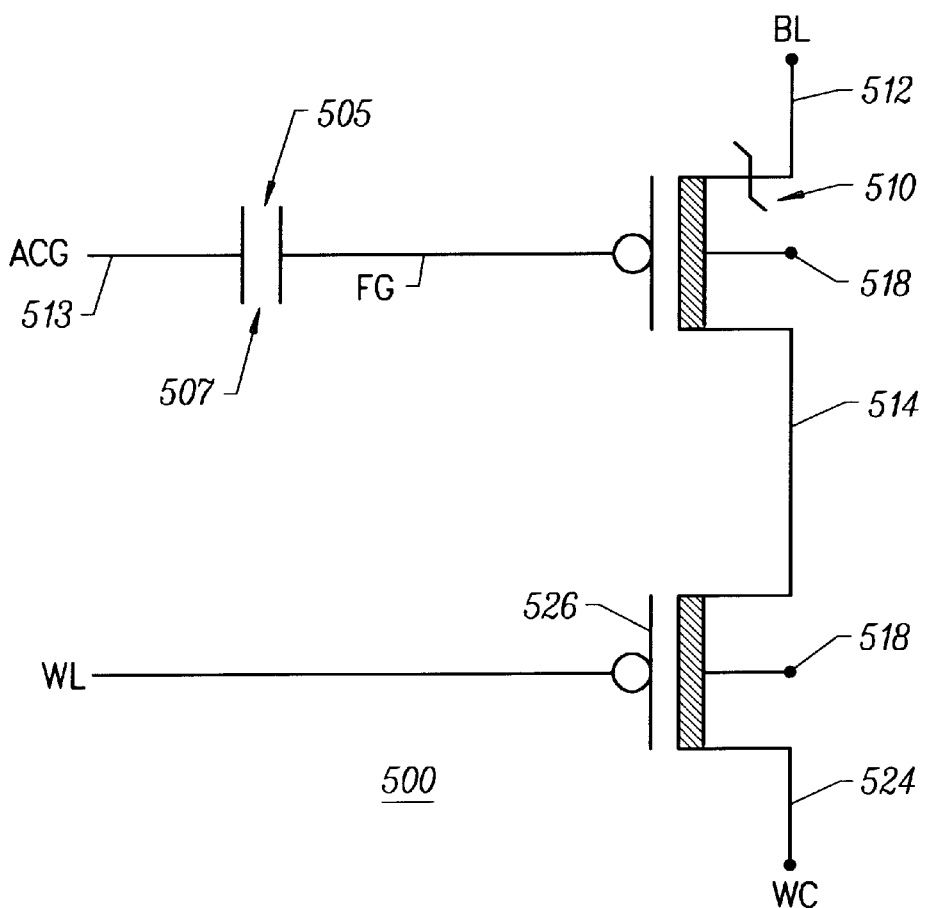
FIG. 5 is a schematic diagram of an EEPROM cell structure of the present invention.

FIG. 5 shows a schematic diagram of a first embodiment of a nonvolatile memory cell structure 500 formed in accordance with one aspect of the present invention.

Structure 500 includes an (array) control gate ACG, a capacitor/oxide 505, floating gate FG, avalanche/Zener program element 510, and a read transistor 520. The control gate ACG is used to accelerate electrons or holes selectively to or from the floating gate by capacitively coupling a field across the oxide that separates the avalanche element 510 from the floating gate.

Capacitor 505 actually comprises a first portion of floating gate FG, oxide layer 507, and diffused ACG region 513. Avalanche/Zener program element 510 shares floating gate FG with ACG region 513 across a device isolation region 530. Element 510 further includes a well contact 518.

Read transistor 520 is a PMOS transistor sharing N-well 515 with program element 510 and shares region 514 of avalanche element 510 as its drain. Gate 526 of read transistor 520 is connected to word line WL. The source of read transistor 520 is connected to a source control signal (WC). Also included is a N-well bias contact 518.

Figure 6:
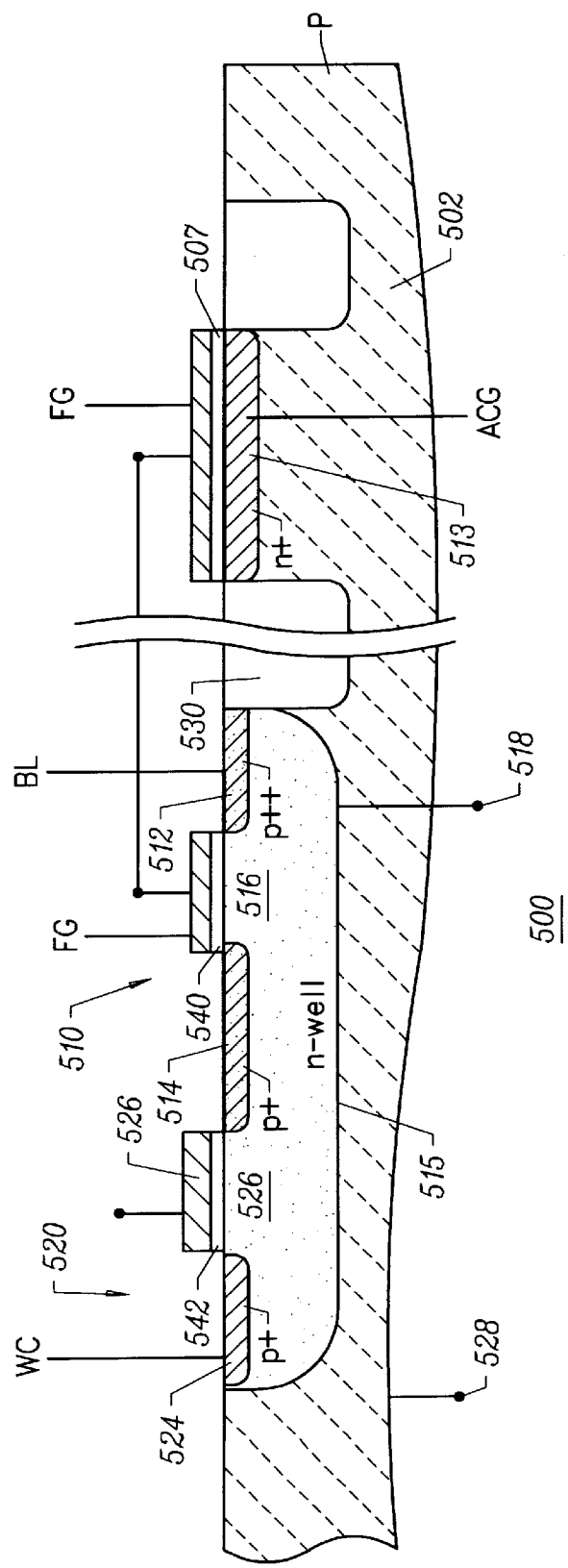
FIG. 6 is a cross-section along lines A-A' and B-B' of FIG. 5 showing one embodiment of the cell of the present invention.

FIG. 6 shows an exemplary cross-section of the embodiment of the EEPROM cell 500 as formed on a semiconductor substrate 502. Silicon substrate 502 has a background doping of first conductivity type such as a P-type conductivity. The EEPROM cell 500 has two separate transistors/elements, namely, an avalanche/Zener element 510, and a read transistor 520. Also provided is a diffused conductive region 513 which is electrically connected to control circuitry, to provide an ACG signal to program or erase cell 500 in accordance with the present invention. Diffused region 513 may be formed alone or in conjunction with other active substrates by implanting, for example, arsenic to a concentration of $2 \times 10^{19} cm^{-3}$. An avalanche/Zener element 510 is electrically separated from region 513 by a first isolation region 530, which may comprise any of a number of well-known isolation structures formed by conventional techniques, e.g. LOCOS, shallow trench isolation and the like, also formed in the semiconductor substrate 510. (It should be recognized that the particular form of device isolation used is not critical to the invention as set forth herein.) An oxide 507 separates region 513 from a portion of floating gate FG.

Avalanche/Zener element 510 has first active region 514 and a second active region 512, all formed within a well region 515 in substrate 502, with a channel 516 positioned therebetween. Well region 515 may comprise an N-type well region having a doping concentration of about $5 \times 10^{16} cm^{-3}$. Overlying the channel 516 is an oxide layer 540. The oxide layer 540 is typically composed of an insulating material, such as silicon dioxide, and has a thickness of approximately 70–110 Å, and in one embodiment, 80 angstroms. Oxide layer 540 may be deposited or grown (using conventional oxide deposition techniques) in a single process step or in conjunction with the formation of other oxide layers of the same or differing thickness hereinafter described.

In one embodiment, region 512 consists of a heavily doped ($>10^{19} cm^{-3}$) boron implanted P+ region formed by, for example, an implant dose of $4 \times 10^{15} - 1 \times 10^{16}$ cm$^{-2}$ BF$_2$. By heavily doping P+ region 512, the junction breakdown voltage $V_{PP}$ (essentially the program/erase voltage) is reduced.

In said embodiment, the region 514 consists of a doped boron implanted P+ region 514 formed by, for example, an implant done of $2-8 \times 10^{13}$ cm$^{-2}$ BF$_2$ followed by a $1-3 \times 10^{15}$ cm$^{-2}$ BF$_2$ implant. In one embodiment, region 514 is more lightly doped than region 512 and in said embodiment, this lower doping concentration reduces junction capacitance and improves the speed of the path used to read data from memory cell 500. Alternatively, region 512 may comprise a P+ diffused region having an adjacent N+ contiguous region provided in accord with the teachings of Ranaweera, et al. and co-pending patent application Ser. No. 09/216,051 filed Dec. 18, 1998, entitled METHOD OF FORMING A NON-VOLATILE MEMORY DEVICE, Inventor Sunil D. Mehta, incorporated fully herein by reference.

According to the present invention, hot carriers generated by Zener/avalanche breakdown are employed to program and erase memory cell 500. Memory cell 500 is erased by, first, reverse biasing the P+N junction formed by P+ region 512 and Nwell region 515. When the floating gate FG potential becomes greater than that of substrate well 515, hot electron injection into the floating gate (FG) is favored. The hot electrons subsequently generated are then "injected" into floating gate FG through oxide layer 540. The resulting net negative voltage on floating gate FG erases memory cell 500.

Memory cell 500 is programmed by, first, reverse biasing the P+N junction formed by P+ region 512 and N well region 515. When the floating gate (FG) potential becomes less than that of the substrate well 515, hot holes subsequently generated are then injected into floating gate FG through oxide layer 540. The resulting net positive voltage on floating gate FG programs memory cell 500.

It should be recognized that other alternative embodiments of Avalanche/zener breakdown cells may be utilized in the present invention without departing from the spirit and scope of the present invention (as in, for example, co-pending patent application Ser. No. 09/216,051 filed Dec. 18, 1998, entitled METHOD OF FORMING A NON-VOLATILE MEMORY DEVICE, Inventor Sunil D. Mehta, incorporated fully herein by reference; and co-pending patent application Ser. No. 09/217,646 filed Dec. 21, 1998, entitled DUAL POCKET, TWO SIDED PROGRAM/ERASE NON-VOLATILE MEMORY CELL, Inventor Sunil D. Mehta, incorporated fully herein by reference.

Read transistor 520 is also formed in well 515, and has a first region 524 formed in the semiconductor substrate 502. Transistor 520 shares well 515 with Avalanche/Zener element 510. A channel 526 is formed between region 524 and region 514. The conductivity of the region 524 and, as noted above, region 514 is, for example, a P+ conductivity type formed in accordance with conventional techniques which may comprise, for example, a first lightly doped drain (LDD) dose of $2-5 \times 10^{14} cm^{-2}$ of boron (BF$_2$)followed by a $2-5 \times 10^{15} cm^{-2}$ dose of boron for the source/drain implant. Overlying the channel 526 is an oxide layer 542 having an approximate thickness of about 35–80 Å. Depending on the formation of the cell, oxide 542 may be formed at the same time as oxide 540, or at a different step. A gate 526 overlies the gate oxide layer 542 and is composed of a conducting material, such as a polycrystalline silicon material. As earlier described, the oxide layer 542 may be simultaneously formed with the oxide layer 540 or formed separately. Depending on the mode of read transistor 520 (depletion or enhancement mode), the relevant voltages for operating the EEPROM cell 500 are adjusted. Read transistor 520 is, in one embodiment, a depletion mode transistor, as is commonly understood in the industry. In a further embodiment, the transistor 520 is an enhancement mode transistor (also as commonly known in the industry).

Floating gate FG overlies the program element 510, oxide layer 540 and oxide 507. Floating gate FG is formed of a conducting material, such as a polycrystalline silicon material.

The elements 510, 520 of EEPROM 500 are electrically coupled to certain electrical lines and gates in order to operate and control the functions of the EEPROM cell 500. As shown in FIGS. 5 and 6, BL is electrically connected to the avalanche element drain 512, word line read (WL) connected to gate 526, and an N-well bias to N-well contact 518. An array control gate (ACG) is electrically connected to diffusion 513. A read control voltage (WC) is connected to the read source 524 of the read transistor 520.

Typical operating voltages for the foregoing lines are given in Table 1:

|  | BL | N-Well | ACG | WC (Source) | WL |
| --- | --- | --- | --- | --- | --- |
| Program | 0v | 4v | 0v | Float | 0V |
| Erase | 0v | 4v | 6v | Float | 0V |
| Read | 0v | 0v | 0v | $(-)V_{CC}$ | $(-)V_{CC}$ |

It should be recognized that avalanche/Zener element 510 can have several alternative structures in addition to that set forth herein, including a structure similar to that set forth in Ranaweera, et al., and/or co-pending U.S. patent application Ser. No. 08/871,589 by Hao Fang, et al. or those set forth in U.S. Pat. No. 4,491,657.

The provision of a PMOS embodiment of the avalanche transistor element provides a number of unique advantages. By replacing the NMOS/p-substrate biased prior art injection element with a PMOS transistor in an N-well, each transistor can be isolated from neighboring devices and individually selected during program and erase. This eliminates the need to have an extremely uniform breakdown voltage distribution within the BitLine (BL) column when EEPROMS of the present invention are provided in an array. As is generally well known, PMOS devices provide improved stability over NMOS devices and hence provide higher reliability for the memory array and programmable logic devices formed in accordance with the invention over other cell embodiments.

The many features and advantages of the present invention will be apparent to one of average skill in the art in view of the illustrative embodiments set forth herein. The present invention has been described herein with respect to particular embodiments for a particular applications. It will be apparent to one of average skill in the art that numerous modifications and adaptations of the present invention may be made in accordance with the invention without departing from the spirit of the scope of the invention as disclosed herein and defined by the following claims.

What is claimed is:

1. A non-volatile memory cell structure, comprising:
   a substrate having a first conductivity type;
   a floating gate;
   a reverse breakdown hot carrier injection program/erase element at least partially formed in a portion of a second conductivity type in a semiconductor substrate, capacitively coupled to the floating gate; and
   a read transistor at least partially formed in a separate region of the semiconductor substrate and connected to the injection element.

2. The structure as defined in claim 1 further comprising:
   a control gate capacitively coupled to the floating gate.

3. The structure as defined in claim 1 wherein the reverse breakdown injection element comprises a first and second active regions separated by a first channel region, all formed in the portion of the semiconductor substrate, and said floating gate is positioned over said first channel region.

4. The structure as defined in claim 3 wherein the read transistor comprises said second active region and a third active region separated by a second channel region, all formed in the portion of the semiconductor substrate.

5. The structure as defined in claim 4 wherein the control gate comprises a diffused region in a second region of the semiconductor substrate.

6. The structure as defined in claim 4 wherein a first gate oxide overlies said first channel region and a second gate oxide overlies said second channel region.

7. The structure as defined in claim 6 wherein the first gate oxide has a thickness of about 70 to 110 Å.

8. The structure as defined in claim 6 wherein the second gate oxide has a thickness of about 30 to 80 Å.

9. The structure as defined in claim 4 wherein said second active region is a lightly doped impurity region and said first active region is a heavily doped impurity region.

10. The structure of claim 3 wherein the portion is an N well formed in a P-doped substrate, and said first and second active regions comprise p-type diffusions in said N-well region.

11. The structure as defined in claim 5 wherein the second region of the substrate comprises a portion of said p-type substrate and said diffused region comprises an n-type region in said substrate.

12. The structure as defined in claim 11 wherein
    said portion of the substrate comprises a well region which is connected to a control voltage.

13. The structure as defined in claim 10 wherein
    said first active region comprises a lightly doped region and said second active region comprises a heavily doped region.

14. The structure as defined in claim 2 wherein the first region in said substrate is an n-well type, and said structure further includes a channel implant in said well, the implant being of the same impurity type as said well.

15. A non-volatile memory cell structure, comprising:
    a semiconductor substrate having a surface and a doping concentration of a first conductivity type;
    a floating gate;
    a control gate coupled to a first portion of the floating gate;
    a hot carrier injection program/erase element including a first active region, and a second active region both formed of said first conductivity type in a well region of a second conductivity type, and a first gate oxide, coupled to a second portion of the floating gate overlying the first gate oxide; and a read transistor having a third active region and sharing said second active region, a second gate oxide, and a read gate overlying the second gate oxide.

16. The structure as defined in claim 15 wherein the first active region and second active region are separated by a first channel region, said floating gate is positioned over said first channel region.

17. The structure as defined in claim 15 wherein the first gate oxide has a thickness of about 70 to 110 Å.

18. The structure as defined in claim 15 wherein the second gate oxide has a thickness of about 30 to 80 Å.

19. The structure as defined in claim 15 wherein the second active region is a lightly doped impurity region and said first active region is a heavily doped impurity region.

20. The structure as defined in claim 16 wherein at least one contiguous region formed by an impurity of an opposite conductivity type to that of the first and second active regions are provided adjacent to one of said first or second active region.

21. The structure as defined in claim 3 wherein
the substrate is a p-type substrate and the well is an n-type well.

22. The structure as defined in claim 16 further including a channel implant in said first channel region, the implant being of the same impurity type as said well.

23. The structure as defined in claim 16 wherein said well region is connected to a control voltage.

24. An EEPROM structure, comprising:

a semiconductor substrate of a first conductivity type having a surface;

a program/erase element including a first active region and second active region formed in the substrate adjacent to the surface of said substrate and the first active region having a doping concentration about 2 to 10 times higher than the source region;

a first transistor formed in the well and having a third active region sharing said second active region with said program element;

a diffused control gate and a floating gate positioned adjacent to the surface and separated from said surface by a gate oxide layer, the floating gate having a first portion overlying the first transistor and at least a second portion overlying the control gate;

wherein the program/erase element is constructed so that a reverse voltage breakdown condition generated at said first or second active regions adds electrons or holes to the floating gate when an appropriate voltage is applied to the gate.

\* \* \* \* \*